United States Patent [19]

Hamerich et al.

[11] Patent Number: 5,395,642

[45] Date of Patent: Mar. 7, 1995

[54] PROCESS FOR DEPOSITING LAYERS HAVING HIGH SPECIFIC ELECTRICAL CONDUCTIVITY

[75] Inventors: Andreas Hamerich, Elmshorn; Joerg Mueller, Buchholz; Guenther Doellein, Hanover; Lars Lottermoser, Klein Meckelsen, all of Germany

[73] Assignee: Solvay Deutschland GmbH, Hanover, Germany

[21] Appl. No.: 168,253

[22] Filed: Dec. 17, 1993

Related U.S. Application Data

[63] Continuation-in-part of Ser. No. 138,434, Oct. 20, 1993.

[30] Foreign Application Priority Data

Oct. 21, 1992 [DE] Germany .......... 42 35 358.0
Jun. 24, 1993 [DE] Germany .......... 43 20 931.9

[51] Int. Cl.$^6$ .......................................... B05D 3/06
[52] U.S. Cl. .................................. 427/8; 427/252; 427/576
[58] Field of Search .......................... 427/8, 252, 576

[56] References Cited

U.S. PATENT DOCUMENTS

| | | | |
|---|---|---|---|
| 4,990,363 | 2/1991 | Suhr et al. | 427/40 |
| 5,013,581 | 5/1991 | Suhr et al. | 427/41 |

FOREIGN PATENT DOCUMENTS

| | | |
|---|---|---|
| 2018464 | 12/1990 | Canada . |
| 291444 | 11/1988 | European Pat. Off. . |
| 299752 | 1/1989 | European Pat. Off. . |
| 321734 | 6/1989 | European Pat. Off. . |
| 329845 | 8/1989 | European Pat. Off. . |
| 460254 | 12/1991 | European Pat. Off. . |
| 472897 | 3/1992 | European Pat. Off. . |
| 4136321 | 5/1993 | Germany . |
| 92/07971 | 5/1992 | WIPO . |
| 92/15723 | 9/1992 | WIPO . |

OTHER PUBLICATIONS

Feurer et al., "Preparation of Gold . . . ", *Appl. Phys.*, vol. A 44, pp. 171-175 (1987) (no month avail).
Oehr et al., "Thin Copper Films . . . ", *Appl. Phys.*, vol. A 45, pp. 151-154 (1988) (no month avail).
Suhr et al., "Plasma CVD Using . . . ", *Journal De Physique*, vol. 50, pp. C5-739-745 (May 1989).
Feurer et al., "Plasma chemical vapor . . . ", *J. Vac. Sci. Technol.*, vol. A7 (4), pp. 2799-2802 (1989) (no month avail).
Oehr et al., "Deposition of Silver . . . ", *Appl. Phys.*, vol. A 49, pp. 691-696 (1989) (no month avail).
Harima et al., "Spectroscopic Study on . . . ", *Jap. J. Appl. Phys.*, vol. 29 (10), pp. 1932-1938 (1990) (no month avail).
Holzschuh et al., "Deposition of Copper . . . ", *Appl. Phys.*, vol. A 51, pp. 486-490 (1990) (no month avail).
Awaya et al., "Plasma-Enhanced Chemical . . . ", *Jap. J. Appl. Phys.*, vol. 30 (8), pp. 1813-1817 (1991) (no month avail).

*Primary Examiner*—Bernard Pianalto
*Attorney, Agent, or Firm*—Evenson, McKeown, Edwards & Lenahan

[57] ABSTRACT

A process for depositing metal-containing layers which have a high specific electrical conductivity, involving the decomposition of organometallic compounds in a hydrogen-containing gas or vapor phase by means of a plasma. The energy density of the plasma is optimized, which involves recording an OES spectrum. It is thus possible to produce, e.g., strongly adhering conductor tracks whose width is less than 50 μm and whose ratio of height to width is greater than 1. Also disclosed are a method for optimizing the deposition of metal-containing layers having a high specific conductivity, and a composite body produced by the process of the invention comprising a polymer substrate and a metal layer deposited thereon.

14 Claims, 3 Drawing Sheets

5,395,642

PROCESS FOR DEPOSITING LAYERS HAVING HIGH SPECIFIC ELECTRICAL CONDUCTIVITY

CROSS-REFERENCE TO RELATED APPLICATION

This application is a continuation-in-part of our co-pending U.S. patent application Ser. No. 08/138,434, filed Oct. 20, 1993.

BACKGROUND OF THE INVENTION

This invention relates to a process for depositing metal-containing layers which have a high specific electrical conductivity, involving the decomposition of organometallic compounds in a hydrogen-containing gas or vapor phase by means of a plasma.

It is known to modify substrates by surface coating in such a way that their surfaces have defined functional properties. For example, it is possible to apply specular metal layers to substrates, layers which conduct electrical currents, layers which harden the surface of the substrate /r protect it against wear, layers which improve the adhesion of further layers, etc. The deposition of layers which contain, for example, copper in metallic form makes it possible to produce conductor tracks conductive to electrical currents on non-conducting substrates, for example on ceramic or organic polymers.

It is possible to deposit thin metal layers, for example, by known CVD processes which involve evaporation of organometallic compounds. The decomposition with the formation of metal-containing layers can be effected, for example, thermally or by plasma induction. A plasma-enhanced CVD process (PECVD process) for depositing copper is described by N. Awaya and Y. Arita in *Jap. J. Appl. Phys.* 30 (1919), pages 1813 to 1817. This involved the introduction and decomposition of copper acetylacetonate in a parallel-plate plasma reactor. The deposited copper layers were studied with respect to their conductivity. It was found that the lowest resistivity of the copper layers occurred at a substrate temperature between 200° C. and 280° C. At deposition temperatures below 100° C., the resistance was so high that it could not be measured.

SUMMARY OF THE INVENTION

It is the object of the invention to provide an improved process for depositing metal-containing layers which have a high specific electrical conductivity on substrates.

Another object of the invention is to provide a process which facilitates controlled deposition of metal-containing layers in a simple manner.

A further object of the invention is to provide a process which enables deposition of metal-containing layers at relatively low temperatures which have a high specific electrical conductivity.

It is also an object of the invention to provide a process which is particularly suitable for depositing metal-containing layers on non-conducting substrates.

These and other objects of the invention are achieved by providing a process for depositing a metal-containing layer having a high specific electrical conductivity onto a substrate, comprising the steps of decomposing an organometallic compound comprising a metal and at least one ligand in a plasma-excited hydrogen-containing gas phase; recording an optical emission spectroscopy (OES) spectrum of said plasma-excited gas phase, whereby a series of peaks assignable to fragments of ligands of said metal and peaks not assignable to fragments of ligands of said metal are obtained; comparing the magnitude of a peak of said OES spectrum not assignable to a fragment of a ligand of said metal to a peak assignable to a fragment of a ligand of said metal to form a ratio, and regulating the energy density of the plasma such that the ratio of said peak not assignable to a fragment of a ligand of the metal (non-ligand fragment) to said peak assignable to a fragment of a ligand of the metal (ligand fragment) is at least as large as the corresponding ratio recorded during deposition of a metal layer having a maximum electrical resistivity equal at most to 200% of the electrical resistivity of the bulk metal.

BRIEF DESCRIPTION OF THE DRAWINGS

The invention will be described in further detail hereinafter with reference to the accompanying drawing figures in which.

DETAILED DESCRIPTION OF PREFERRED EMBODIMENTS

Figure 1:
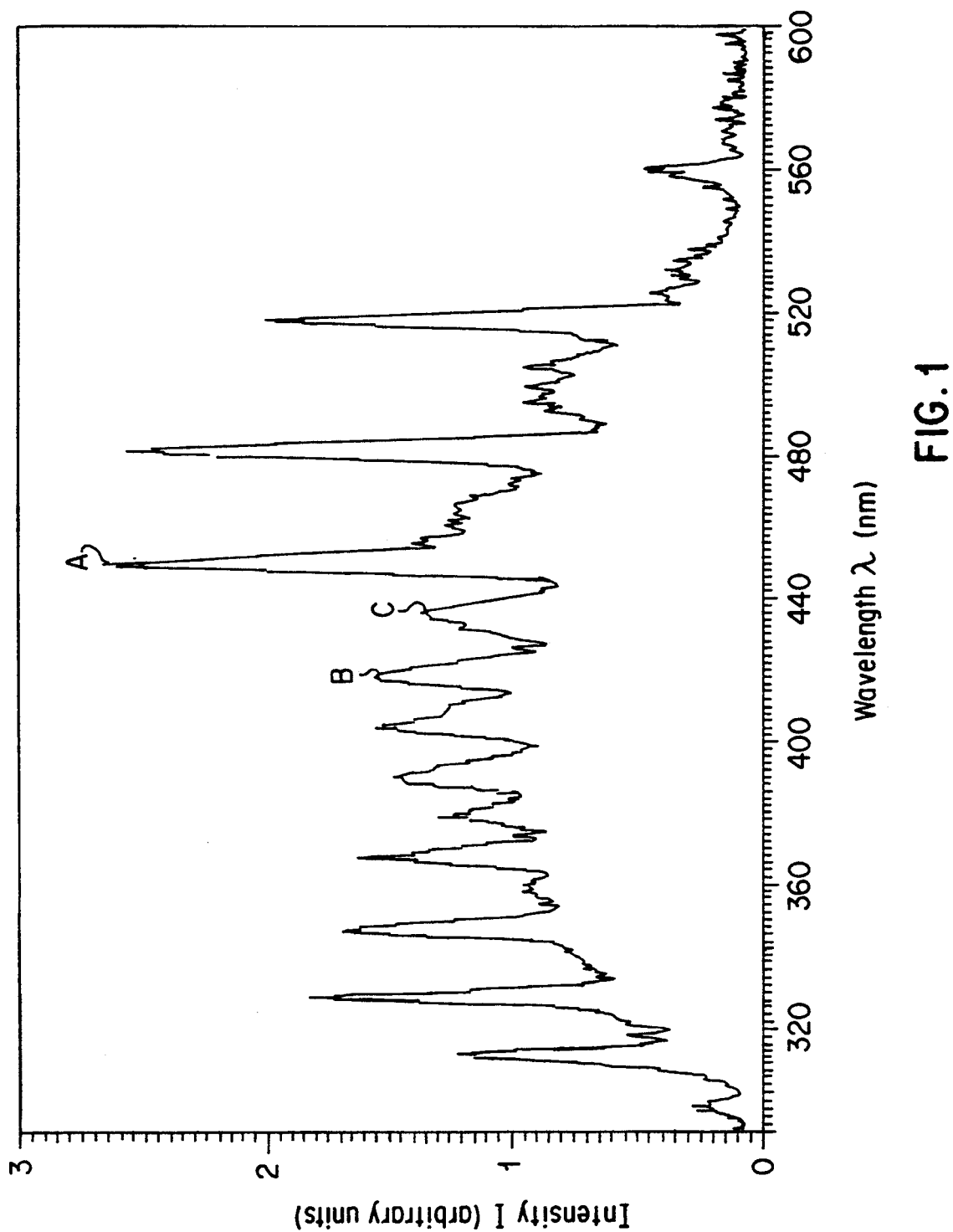
FIG. 1 is a graph representing an optical emission spectrum of a plasma used in the process of the invention.

The process according to the invention for depositing metal-containing layers which have a high specific electric conductivity, involving the decomposition of organometallic compounds in a hydrogen-containing gas or vapor phase by means of a plasma, is characterized in that an optical emission spectroscopy (OES) spectrum of the plasma-excited gas or vapor phase is measured or recorded, and the energy density of the plasma is adjusted in such a way that the ratio of a peak not assigned to a fragment of a ligand of the metal (non-ligand fragment) to a fragment of a peak assigned to a ligand (ligand fragment) is at least as large as the corresponding ratio recorded during the deposition of a metal layer which has at most 200% of the electrical resistivity of the bulk material.

The simplest way of recording the OES spectrum is through a window in the plasma reactor using an OES spectrometer in the computer controlled mode. The peak assigned to a non-ligand fragment may be, for example, a metal peak, a ligand peak or a metal hydride peak.

The process of the invention can be used to decompose organometallic compounds having a σ and/or π bond between the metal and the ligand or ligands. For example, organometallic compounds which contain metal-carbon bonds can be decomposed, for example metal-alkyl, metal-alkene, metal-aryl, metal-arene and/or metal-carbonyl groups. Organometallic compounds having metal-heteroatom bonds can likewise be used. For example, compounds with ligands bonded to the metal via nitrogen, such as metal-ketiminato complexes, can be used. The process is especially suitable for decomposing organometallic compounds having metal-oxygen bonds, preferably compounds in which the metal is complexed with one or more β-diketonate groups. The process is especially well suited for decomposing organometallic compounds of semiprecious metals, especially copper, and of noble metals, especially of silver, gold and platinum-group metals.

The process according to the invention is particularly suitable for decomposing compounds in which the metal copper is complexed with β-diketonates selected from the group consisting of β-diketonates containing from 5 to 11 carbon atoms and β-diketonates containing from 5 to 11 carbon atoms substituted by from 1 to 18 halogen atoms, preferably substituted by from 1 to 6 fluorine atoms. Particularly suitable compounds include copper acetylacetonate, copper heptanedionate, copper dimethylheptanedionate and copper tetramethylheptanedionate. Copper hexafluoroacetylacetonate and copper trifluoroacetylacetonate are also highly suitable.

Molybdenum and/or tungsten carbonyls substituted by organic radicals, as described in published German patent application No. DE 4,136,321, likewise give good deposition results in the process of the invention. These are compounds corresponding to the formula $MR^1R^2(CO)_3$, where M represents molybdenum or tungsten, $R^1$ is, e.g., cyclopentadienyl or cyclopentadienyl substituted by C1-C3-alkyl groups, and $R^2$ is, e.g., C1-C5-alkyl; C2-C5-alkenyl; C1-C3-alkoxy; phenyl; substituted phenyl; or heteroaryl. Specific examples of particularly suitable compounds include $MO(C_5H_5)(CH_3)(CO)_3$, $W(C_5H_5)(CH_3)(CO)_3$, $MO(C_5H_5)(C_2H_5)(CO)_3$, and $W(C_5H_5)(C_2H_5)(CO)_3$. The preparation of such compounds is known and is described in DE 4,136,321. For example, $(CH_3)(C_5H_5)W(CO)_3$ can be prepared by reacting $C_5H_5Na$ with $W(CO)_6$, and then reacting the resulting sodium salt of the (tricarbonyl-cyclopentadienyl)tungstate with methyl iodide.

A capacitively coupled RF plasma is preferably used to induce decomposition of the organometallic compound. The decomposition is preferably induced with a pulsating plasma, particularly a radio-frequency (RF) plasma in the range from 3 to 30 MHz. A typically used frequency is 13.56 MHz.

The deposition can be carried out in conventional plasma CVD apparatus. Apparatus of this type comprise an evacuatable receiver (reactor) and one, two or, if desired, even more electrodes. Apparatus used in the adjustment of the plasma energy density in the process of the invention must also have a window through which the OES spectrum can be measured or recorded. In addition, the apparatus may include conventional components such as lines for feeding in gases and/or the organometallic compounds, connections for generating the vacuum, sensors for measuring the temperature of the substrate, the electrodes, the reactor wall, sensors for measuring the vacuum, etc.

Apparatus having a single electrode (the other electrode being formed by the reactor wall) or apparatus having electrodes arranged in parallel ("parallel-plate reactor") are especially suitable. The single electrode or one of the two electrodes is connected to the frequency generator, and the reactor wall or the other of the two electrodes is advantageously insulated electrically or (chassis) grounded. If desired, the direct-voltage potential of the cathode vis-a-vis the chassis can be changed by applying a bias voltage, which makes it possible to modify the deposition and the properties of the deposited metal layer, particularly at a low substrate temperature.

In accordance with one embodiment of the invention, the deposition is carried out anodically. In this case, the substrate to be coated is disposed in the vicinity of the chassis grounded or electrically insulated anode, which is usually larger than the cathode. In order to obtain metallic layers which adhere especially strongly, the substrate, for example inorganic materials such as ceramics or glass, or organic materials such as polymers (e.g. plastics), can be pretreated, e.g. by a plasma treatment ("presputtering"). A chemical pretreatment can also be carried out. Such a pretreatment with organic compounds is described in published PCT patent application no. WO 92/15723.

In accordance with another embodiment of the invention, which produces particularly advantageous results and is therefore a preferred embodiment, the deposition is carried out cathodically. In this case, the substrate to be coated is disposed in the vicinity of the cathode, which in turn is connected to the frequency generator. The process is particularly effective if the ratio of the area of the cathode to that of the anode is greater than 2:1, preferably greater than 4:1. This embodiment of the process can be used to coat inorganic materials which are typically used as substrates, e.g. semiconductors, insulators, ceramic, glass phases, and carbon, especially carbon fibers. This embodiment is especially suitable for coating organic polymers. A composite body having particularly good properties, especially with regard to the adhesion of the metal layer, is formed from the metal layer and the polymer substrate, which may, for example, be formed of plastics such as epoxy resin, glass fiber-reinforced epoxy resin, polyamide, polyimide, polyethylene, poly-propylene, polyphenylene sulfide, or halogen-containing polymers. The direct-voltage potential of the cathode vis-a-vis the chassis can likewise be changed during cathodic deposition by applying a bias voltage in order to regulate layer formation or the properties of the deposited layer. The embodiment involving cathodic deposition is particularly advantageous because it produces metal layers which adhere strongly, particularly to organic polymers, without any need to pre-treat the substrate to enhance adhesion. Furthermore, layers can be formed at a very high deposition rate ranging up to 10 nm/min and more. Such high rates of deposition of highly conductive layers of, e.g., copper using copper acetylacetonate or copper hexafluoroacetylacetonate at such low substrate temperatures (<100° C.) have not previously been disclosed in the prior art.

Of course, it is also possible to successfully deposit metal-layers using plasma apparatus with equipotential electrodes.

The organometallic compound to be evaporated, is heated in a receiver or in a separate device, e.g. an evaporator, to the temperature at which the desired vapor pressure is attained. The temperature of the substrate and/or the wall of the receiver is advantageously at least 5° C. higher than the temperature of the organometallic compound which is to be converted into the gas or vapor phase in the evaporator. Preferably, the substrate temperature and/or wall temperature is from 5° to 25° C. higher than the temperature of the compound in the evaporator. The substrate temperature is preferably in the range from room temperature to 120° C. Even at higher temperatures it is still possible to achieve satisfactory results. The pressure in the receiver is advantageously above 100 mtorr. The best results are obtained with a receiver pressure of up to 5 torr. The optimum ranges of substrate temperature and gas pressure in the receiver will depend on the particular metal compound used. If needed, appropriate small-scale tests in accordance with the process of the invention can be carried out to determine the optimum conditions. For copper compounds such as copper acetylacetonate, for example, the optimum temperature is in the range from room temperature to 120° C., and the optimum pressure is in the range from 500 mtorr to 3 torr.

The process gas preferably is hydrogen. If desired, however, up to 80 volume-% of the hydrogen can be replaced by one or more inert gases, e.g. by a noble gas such as argon or xenon.

The process according to the invention, especially in the case of cathodic deposition, can be used to deposit metal layers having a thickness of 2000 nm and more. Using this process it is possible to successfully deposit layers having a resistivity which is at most 200% of that of the bulk material, preferably 130% and less. It is particularly preferred to use the process of the invention to produce metal layers, especially copper layers, having a thickness of from 200 to 2000 nm and a maximum resistivity equal at most to 200% of that of the bulk material. This is achieved very rapidly, especially with cathodic deposition, since even at low temperatures it is possible to attain a surprisingly high deposition rate, for example, in the range from 2 nm/min up to 10 nm/min or more.

The invention further relates to a method for optimizing the deposition of metal-containing layers having a resistivity which is at most 200% of the electrical resistivity of the bulk material. This method according to the invention envisions that, in order to optimize the deposition of metal-containing layers by decomposition of an organometallic compound in a hydrogen-containing gas or vapor phase by means of a plasma and thereby obtain metal layers having a resistivity which is at most 200% of the electrical resistivity of the bulk material, the energy density of the plasma used to induce the decomposition is controlled as follows:

a) The decomposition is carried out at a plasma energy density which is at least sufficient to fragment ligands of the organometallic compound being decomposed.

b) The OES spectrum is measured, and peaks are determined which cannot be ascribed to a fragment of the ligand (non-ligand fragment), as well as those which can be ascribed to a specific fragment of the ligand.

c) The resistivity of the deposited layer is optimized by reducing the high energy density used in step a), until in the OES spectrum a peak not assigned to the ligand (non-ligand fragment) and the peak assigned to the fragment of the organic molecule portion have a minimum ratio which corresponds to the desired requirements of the conductivity of the deposited layer.

The process pressure and the deposition temperature are initially selected to have fixed values, e.g. 650 mtorr and 100° C.

The invention further relates to metal layers produced according to the process of the invention, which layers have a thickness of from 200 to 2000 nm and a resistivity of at most 200% of that of the bulk material. Copper layers are especially preferred.

The invention also relates further to composite bodies comprising polymeric material, optionally one or more intermediate layers, and a metal layer having a thickness of from 200 to 2000 nm and a resistivity of at most 200% of that of the bulk material.

Such composite bodies can be produced by the process of the present invention. They are characterized by very high stability and by very high adhesion between the metal layer and the polymer substrate. Composite bodies of copper/epoxy resin, copper/polyimide, copper/polyamide, copper/polyethylene and copper/polypropylene are particularly preferred. The intermediate layers which optionally may be present in the composite body are intermediate layers produced according to conventional methods. These include, for example, layers which are designed to provide a protective surface coating, for example against abrasive wear, or to promote adhesion. Examples include layers of titanium nitride or of boron nitride.

Particularly advantageous properties are shown by composite bodies comprising polymer substrates which carry metal layers in the form of conductor tracks. The invention also relates to composite bodies of this type. They can be obtained by initially depositing on the polymer substrate a first metal layer in accordance with the process of the invention. This first metal layer then has a covering layer applied to it. For this purpose it is possible, for example, to spin-deposit a resist layer as a covering layer, whose thickness is variable and maybe, e.g., 10 $\mu$m or more. The resist layer is then patterned photolithographically. For example, tracks having a width of 10 $\mu$m can be produced. Even smaller structures are likewise possible. Subsequently, a second metal layer is electrodeposited to form conductor tracks. Advantageously, the second metal layer should not be substantially thicker than the resist layer. The covering layer is then removed, e.g. by suitable solvents such as acetone. In doing so, the first metal layer, which had been applied according to the process of the invention, is exposed again. The exposed metal layer is then etched away, e.g. by means of suitable acids or acidic compounds.

Between the polymer (for a list of suitable polymers see above) and the metal layer or covering layer, one or more intermediate layers optionally may also be provided, for example intermediate layers which insulate electrical currents or enhance the adhesion of individual layers.

The process for producing conductor tracks is explained in further detail with reference to FIG. 3, which consists of a series of seven pictorial representations, each of which comprises two figures associated in pairs. In each case, the upper figure shows a cross-section through the printed-circuit, and the lower figure represents a plan view of the printed circuit board. The printed-circuit board material is shown as hatched; the resist layer is indicated by dots, and the first metal layer and the second metal layer representing the conductor track are solid black.

Figures 3A, 3B, 3C:
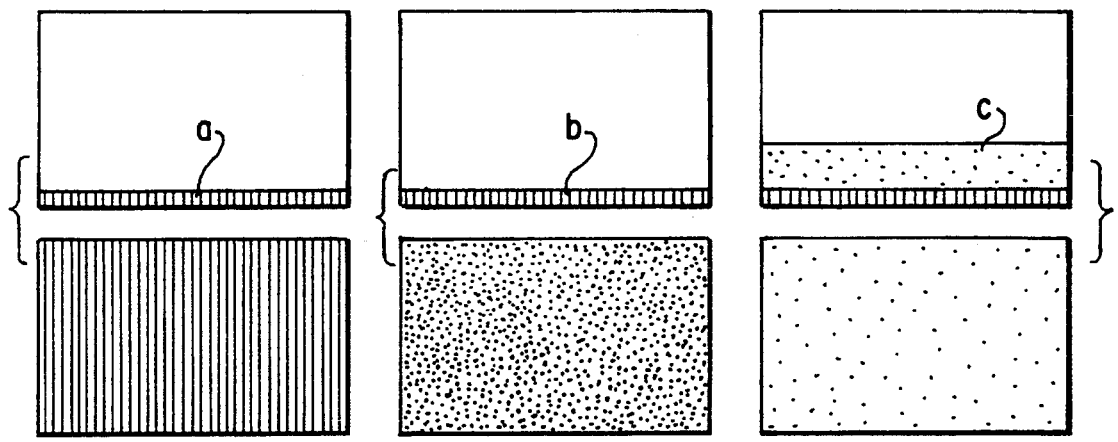
FIG. 3 is a schematic representation of the steps of a preferred embodiment of the process of the invention for depositing a conductive track on a non-conductive substrate.
Figures 3D, 3E, 3F:
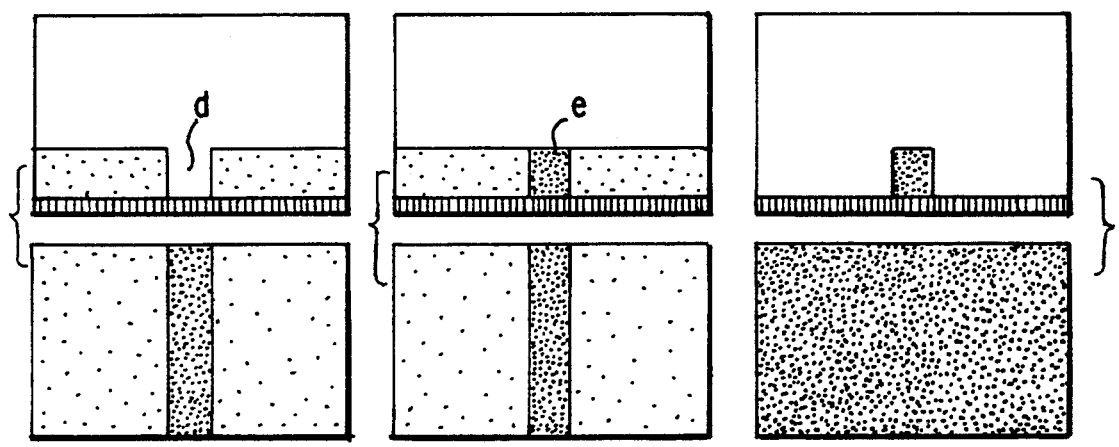
Figure 3G:
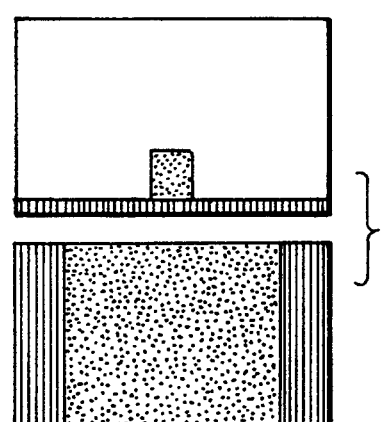

Onto the printed-circuit board a (for example glass fiber-reinforced epoxy resin) in representation 1 of FIG. 3, the metal layer b is deposited according to the invention. Onto the resulting composite body, see representation 2, a resist layer c is spin-deposited, the result being illustrated in representation 3. Photolithographic patterning is employed to remove defined regions d of the resist layer, in order to produce a composite body corresponding to the depiction in representation 4. A metal layer e is then selectively electrodeposited on top of the regions d. This is followed by initially removing the resist layer c and then removing the exposed metal layer b on the printed-circuit board a. A composite body having conductor tracks thereon then remains.

Particularly preferred composite bodies with conductor tracks have a tungsten, molybdenum or, especially, copper layer as the first metal layer. If the first metal layer is deposited cathodically, composite bodies are obtained with especially high mechanical strength. The second metal layer which forms the conductor tracks is preferably a copper layer.

The width of the conductor tracks is preferably smaller than 50 $\mu$m, in particular smaller than 30 $\mu$m, particularly preferably smaller than 10 $\mu$m. The ratio of height to width of the conductor tracks may vary, depending on the type of photolithographic processing used. Preferably the ratio of height to width of the conductor tracks is greater than 1, e.g. up to 10 or more.

The process according to the invention has the advantage, not previously attained in the art, of making it possible to deposit, at a low deposition temperature, in a controlled manner and with a constant quality, metal layers at a high deposition rate, which are notable for high adhesive strength and low electrical resistivity. This advantage is especially apparent in composite bodies having conductor tracks. In such bodies the cathodically deposited layer adheres so strongly that edges of forced fractures are situated in the layer material of the electrodeposited layer and not in the region of the layer deposited according to the invention.

The invention will be described in further detail with reference to working examples which are merely illustrative and are not limiting on the scope of the invention.

The peaks "A", "B" and "C" in the various examples relate to the same ligand fragments and non-ligand fragments.

EXAMPLE 1

Deposition of a copper layer on polyimide.
1.1. Apparatus used:
A plasma apparatus containing a substrate electrode was used. Its diameter was 78 mm. The diameter of the "counterelectrode", represented by the receiver cover, was 156 mm; the inner walls of the receiver represent additional effective counterelectrode surfaces. The area ratio of the substrate electrode to the counterelectrode connected to chassis was greater than 4:1 overall. The electrode gap could be varied in the range from 30 to 80 mm. The pressure was measured using a "Baratron" (capacitance manometer). The power source used was an RF generator having a transmission frequency of 13.56 MHz, whose output could be regulated over the range from 0 to 300 W. The heating of the substrate could be varied in the range from 20° to 500° C. An OES spectrometer in the computer controlled mode was able to compile spectra of the plasma chamber through a window on the receiver.
1.2. Deposition Procedure:
The substrate electrode was connected to the frequency generator, whose output was set to 40 W. Copper(II) acetylacetonate was introduced as the precursor into an evaporator located in the receiver and was heated in the evaporator to 115° C. The substrate used was glass, which was brought to a temperature of 120° C. The process gas was hydrogen, the total pressure in the receiver was 1000 mtorr. The deposition was performed for a duration of 26 minutes.

The layer thickness of the deposited layer was 125 nm, the average growth rate therefore 4.8 nm/min. The conductivity was carried out via a so-called "4-point measurement" according to van der Pauw, Philips Res. Repts. Vol. 13, pages 1–9 (1958). The electrical resistivity was determined as being from 2.2 to 2.3 $\mu\Omega$cm, which is approximately 130% of the value for bulk copper.

While the deposition process was carried out, an OES spectrum was recorded which is depicted in FIG. 1.

The peak designated with "B" is the signal of a non-ligand fragment. The peaks designated with "A" and "C" are ascribed to the ligand fragment "carbon monoxide". The intensity ratio (based on the peak height) B/A is 0.379, the intensity ratio B/C is 1.333.

EXAMPLE 2

Cathodic deposition on polyimide sheet.
The procedure of Example 1 was repeated except that the substrate employed was a polyimide sheet (from DuPont, USA). The results corresponded to those of Example 1.

EXAMPLE 3

Figure 2:
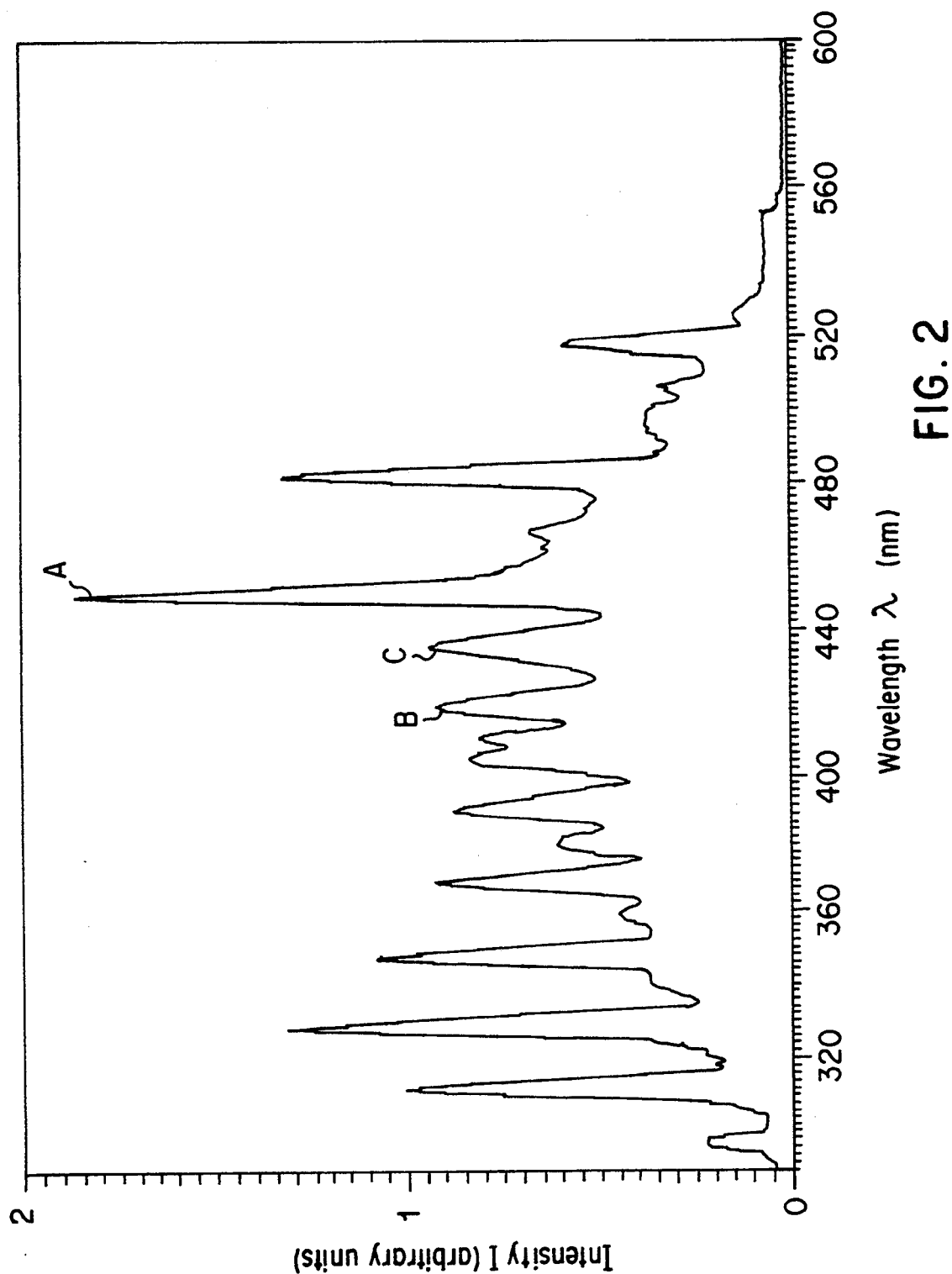
FIG. 2 is a second graph representing an optical emission spectrum of another plasma.

Cathodic deposition of a non-conductive layer.
Example 1 was repeated. The output of the frequency generator was adjusted to 90 W, the substrate used was again glass, the process duration was 12 min. The deposited layer was found to be non-conductive. An OES spectrum recorded during the deposition is depicted in FIG. 2. The peak designated by "B" is assigned to a non-ligand fragment, while the peaks designated with "A" and "C" are assigned to a ligand fragment, namely carbon monoxide. The intensity ratio of the peaks B/A is 0.167, the intensity ratio of the peaks B/C is 0.781.

The examples document that it is possible, by means of recording OES spectra and comparing certain peaks with one another, to adjust the RF output beamed into the plasma decomposition process in order to achieve optimum conductivity of the deposited layer.

EXAMPLE 4

Anodic deposition.
In this example, the substrate electrode was connected to chassis, and a counterelectrode was introduced into the receiver cover and was connected to the frequency generator. The frequency generator was set to an output of 10 W. The pressure in the apparatus was 628 mtorr, the process gas used was a mixture of argon and hydrogen. The substrate employed was a disc made of silicon nitride. The process duration was 150 min.

The deposited layer thickness was 57 nm, the conductivity was 3.02 $\mu\Omega$cm (measured according to the 4-point method).

The example documents that readily conductive layers can also be deposited anodically.

EXAMPLE 5

Preparation of tungsten layers.
Methyl-tricarbonyl-cyclopentadienyl-tungsten was employed, which had been obtained, in accordance with Example 1 of DE 4,136,321, by reacting W(CO)$_6$ with C$_5$H$_5$—Na and subsequent reaction with methyl iodide.

The cathodic deposition according to Example 1 gave conductive tungsten layers.

EXAMPLE 6

Fabrication of a printed-circuit board having conductor tracks.
Standard printed-circuit board material (glass fiber-reinforced epoxy resin) was used. In accordance with Example 1, a strongly adhesive first metal layer having a thickness of 0.1 μm was deposited using copper hexafluoroacetylacetonate as the organometallic compound to be decomposed. A resist layer having a thickness of 10 μm was spin-deposited onto the first metal layer, and then the resist layer was patterned photolithographically, whereby track-like regions of the first metal layer were selectively exposed as a result of the patterning process. A copper layer having a thickness of 25 μm was electrodeposited onto these tracks. The resist layer was removed by means of acetone, and the composite body was etched by wet-chemical techniques to remove the portions of the first copper layer exposed by removal of the resist layer. The result is a printed-circuit board having very strongly adhering conductor tracks.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A process for depositing a metal-containing layer having a high specific electrical conductivity onto a substrate, said process comprising the steps of:

decomposing an organometallic compound comprising a metal and at least one ligand in the presence of said substrate in a plasma-excited hydrogen-containing gas phase;

measuring an optical emission spectrum of said plasma-excited gas phase, whereby a series of peaks assignable to fragments of ligands of said metal and peaks not assignable to fragments of ligands of said metal are obtained;

comparing the energy density of a peak of said optical emission spectrum not assignable to a fragment of a ligand of said metal to a peak assignable to a fragment of a ligand of said metal to form a ratio, and regulating the energy density of the plasma such that the ratio of said peak not assigned to a fragment of a ligand of the metal to said peak assigned to a fragment of a ligand of the metal is at least as large as the corresponding ratio recorded during deposition of a metal layer having an electrical conductivity equal to at most 200% of the electrical resistivity of said metal in bulk;

whereby an electrically conductive layer of said metal is deposited on said substrate.

2. A process according to claim 1, wherein said organometallic compound contains metal-oxygen bonds.

3. A process according to claim 1, wherein said organometallic compound comprises a metal complexed with at least one β-diketonate group.

4. A process according to claim 1, wherein said organometallic compound comprises copper complexed with at least one β-diketonate selected from the group consisting of β-diketonates containing from 5 to 11 carbon atoms and β-diketonates containing from 5 to 11 carbon atoms substituted by from 1 to 18 halogen atoms.

5. A process according to claim 4, wherein said organometallic compound comprises copper complexed by at least one β-diketonate containing from 5 to 11 carbon atoms substituted by from 1 to 6 fluorine atoms.

6. A process according to claim 1, wherein said organometallic compound is selected from the group consisting of molybdenum carbonyls substituted by organic radicals and tungsten carbonyls substituted by organic radicals.

7. A process according to claim 1, wherein said metal-containing layer is deposited anodically.

8. A process according to claim 1, wherein said metal-containing layer is deposited cathodically.

9. A process according to claim 8, wherein said substrate is an organic polymer substrate.

10. A process according to claim 1, wherein said organometallic compound is converted into the gas phase in an evaporator, and said substrate has a temperature at least 5° C. higher than said organometallic compound in the evaporator.

11. A process according to claim 10, wherein said substrate has a temperature from 5° C. to 25° C. higher than organometallic compound in the evaporator.

12. A process according to claim 1, wherein said substrate has a temperature in the range from room temperature to 120° C.

13. A process according to claim 1, wherein a capacitively coupled RF plasma is used to produce said plasma-excited phase.

14. A method for optimizing the deposition of metal-containing layers having a resistivity which is at most 200% of the electrical resistivity of the bulk material, involving the decomposition of an organometallic compound in hydrogen-containing gas or vapor phase by means of a plasma, conditions with regard to the energy density of the plasma being employed which can be determined as follows:

a) The decomposition is carried out at an energy density of the plasma which is at least sufficient for ligands of the organometallic compound to be decomposed to be fragmented.

b) The OES spectrum is measured and peaks are determined which cannot be ascribed to a fragment of the ligand (non-ligand fragment), as well as those which can be ascribed to a defined fragment of the ligand.

c) The resistivity of the deposited layer is optimized by reducing the high energy density set in a), until a peak not assigned to the ligand (non-ligand fragment) and the peak assigned to the fragment of the ligand, in the OES spectrum, have a minimum ratio such as to correspond to the desired requirements of the conductivity of the deposited layer.

* * * * *